US009414522B2

(12) United States Patent
Walch et al.

(10) Patent No.: US 9,414,522 B2
(45) Date of Patent: Aug. 9, 2016

(54) FLAMEPROOF PRESSURE-TIGHT ENCAPSULATED HOUSING WITH COOLING DEVICE

(71) Applicant: R. Stahl Schaltgerate GmbH, Waldenburg (DE)

(72) Inventors: Otto Walch, Gerabronn (DE); Jurgen Poidl, Kocherstetten (DE)

(73) Assignee: R. Stahl Schaltgeräte GmbH, Waldenburg (DE)

( * ) Notice: Subject to any disclaimer, the term of this patent is extended or adjusted under 35 U.S.C. 154(b) by 117 days.

(21) Appl. No.: 14/269,376

(22) Filed: May 5, 2014

(65) Prior Publication Data

US 2014/0328022 A1    Nov. 6, 2014

(30) Foreign Application Priority Data

May 6, 2013   (DE) .......................... 10 2013 104 627

(51) Int. Cl.
*H05K 7/20*       (2006.01)
*H05K 5/06*       (2006.01)

(52) U.S. Cl.
CPC .............. *H05K 7/20281* (2013.01); *H05K 5/06* (2013.01); *H05K 5/069* (2013.01); *H05K 7/20218* (2013.01)

(58) Field of Classification Search
CPC .. H05K 2/20281; H05K 5/06; G06F 11/2294; G06F 3/1207; G06F 3/1219; G06F 3/1273
USPC ............................ 361/284, 679.53, 698–701; 165/104.19–104.25
See application file for complete search history.

(56) References Cited

U.S. PATENT DOCUMENTS

| | | | | |
|---|---|---|---|---|
| 4,301,325 A * | 11/1981 | Hutchison | ............ | H02G 3/0616 156/242 |
| 4,616,694 A * | 10/1986 | Hsieh | ..................... | A62B 13/00 165/47 |
| 4,796,159 A * | 1/1989 | Miksche | .............. | H05K 7/1461 174/50 |
| 4,809,129 A * | 2/1989 | Hansen, III | ............. | F25B 41/00 137/392 |
| 4,847,602 A * | 7/1989 | Altland | ................... | G06F 1/182 345/10 |
| 5,855,119 A * | 1/1999 | Pfister | ..................... | F25B 17/08 257/E23.088 |
| 2004/0008483 A1* | 1/2004 | Cheon | ....................... | G06F 1/20 361/679.53 |
| 2010/0288467 A1* | 11/2010 | Manahan | ............... | F28D 15/00 165/54 |

\* cited by examiner

*Primary Examiner* — Adam B Dravininkas
(74) *Attorney, Agent, or Firm* — Leydig, Voit & Mayer, Ltd.

(57) ABSTRACT

A pressure-tight encapsulated housing (10) having a temperature control device (20) including a first heat exchanger unit (21) arranged in the interior of the housing (10) and a second heat exchanger unit (22) arranged outside of the housing (10) and which are connected to one another via a liquid cycle (23). The liquid cycle (23) includes a feed line (24) and a return line (25) each connected to the first heat exchanger unit (21) and which each fluidically connect to a passage channel (27) of a respective leadthrough unit (26) arranged in flameproof manner in a wall (13) of the housing (10) so that the passage channel (27) extends through the wall (13). The control device (20) further includes a liquid monitoring sensor (41) for generating a liquid monitoring signal (F) characteristic of the filling of the passage channels (27) with liquid, and a monitoring unit (40) for receiving signals generated by the liquid monitoring sensor (41).

16 Claims, 2 Drawing Sheets

FLAMEPROOF PRESSURE-TIGHT ENCAPSULATED HOUSING WITH COOLING DEVICE

FIELD OF THE INVENTION

The present invention relates to a pressure-tight encapsulated housing comprising a temperature control device, which encompasses a first heat exchanger unit, arranged in the interior of the housing, and a second heat exchanger unit arranged outside of the housing. The two heat exchanger units are connected to one another via a liquid cycle. In this manner, components can be cooled and/or heated, as needed in the pressure-tight encapsulated housing.

BACKGROUND OF THE INVENTION

A housing of the foregoing type, for example, is known from WO 2010/132211 A1. The two heat exchanger units inside and outside of the housing, respectively, are connected to one another via coolant pipes, which are guided through the wall of the housing.

The wall leadthrough of the pipes, however, can impact the flameproof guarantee of the housing. The pressure-tight encapsulated housing described in DE 101 52 510 A1 provides a coolant passage, having a pressure-tight barrier comprising a plurality of passage channels for the liquid coolant. Coolant flows through the barrier and the barrier represents the flameproof guarantee within the pipe between the interior of the pressure-tight encapsulated housing and the environment. Such barriers, however, increase the flow resistance, which, in turn, causes conveyance of the coolant along the cooling cycle to require increased power.

U.S. 2010/0284150 A1 describes an explosion-protected housing. To guarantee the flameproof air flow through the interior of the housing, two flame barriers of sintered material are inserted into connection pieces at wall passages. On principle, this approach corresponds to the content of DE 101 52 510 A1, wherein the cooling in the housing is effected by means of an air circulation instead of by means of a liquid cooling medium. The air cooling of components in the interior of the housing, however, is insufficient in many cases.

OBJECTS AND SUMMARY OF THE INVENTION

It is an object of the invention to provide an explosion-protected housing in an ignition protection-type pressure-tight encapsulation (Ex-d), which has an improved temperature control device for cooling and/or heating one or a plurality of components arranged in the interior of the housing.

The subject pressure-tight encapsulated housing includes a temperature control device comprising two heat exchanger units, which are connected to one another via a liquid cycle or circuit through which a liquid heat transfer medium circulates. The first heat exchanger unit is arranged in the interior of the housing while the second heat exchanger unit is located outside of the housing. Heat can be emitted to the liquid via the one heat exchanger unit and heat can be absorbed by the liquid and the heated liquid can be cooled via the other heat exchanger unit. It is thus possible to control the temperature of the interior of the housing or the components located therein, respectively, by either cooling or heating them. In many cases, it will be necessary to absorb the heat emitted by the electrical components in the interior of the housing by means of the first heat exchanger unit and to transport it via the liquid in the liquid cycle outside to the second heat exchanger unit where it is emitted into the environment.

In the housing, the liquid cycle includes a feed line and a return line, which in each case are fluidically connected to the first heat exchanger unit. The two lines are in each case connected to a leadthrough unit. The feed line and the return line are in each case fluidically connected to a passage channel of the leadthrough unit. Via a flameproof fastening means, the leadthrough unit is arranged in a flameproof manner in one of the walls of the housing, wherein the passage channel in the interior of the leadthrough unit extends through the wall. The passage channel preferably is cylindrical and extends through a leadthrough body of the leadthrough unit.

The pressure-tight encapsulated housing furthermore includes at least one liquid monitoring sensor. Alternatively, it is also possible to provide for a plurality of liquid monitoring sensors and to assign a separate liquid monitoring sensor to each passage unit. The liquid monitoring sensor generates a liquid monitoring signal, which is transmitted to a monitoring unit. The liquid monitoring signal of the liquid monitoring sensor indicates the filling of the passage channels or of the respective assigned passage channel, respectively, with liquid. The liquid monitoring signal is characteristic of whether the cross section of the passage channel or of the passage channels, respectively, is or are filled sufficiently and in particular completely with liquid of the liquid cycle, thus whether or not no spark gap can have formed within a passage channel.

The liquid monitoring sensor can be in the form of a fill level sensor, for example. It also is possible to determine the fill level indirectly via a pressure sensor, which measures the liquid pressure in the liquid cycle. The filling of the passage channels can also be determined directly or indirectly via volume and mass flow sensors, temperature sensors or the like. A plurality of liquid monitoring sensors can also be present, which detect different characteristic variables, such as fill level, pressure or temperature, e.g.

Due to the monitoring of the filling of the passage channels of the leadthrough units, flame barriers are not necessary within the liquid cycle and can be omitted. A pressure-tight embodiment or encapsulation, respectively, of the liquid cycle and of the heat exchanger units also is not necessary. The liquid cycle can thus be used without flow-hindering flame barriers in the leadthrough units and an optional liquid pump can be operated with lower pump power requirements and improved efficiency through this.

Advantageously, the monitoring unit is connected to a controllable separating device. An electrical supply line leads into the interior of the pressure-tight encapsulated housing so as to supply the electrical and/or electronic components present therein with electrical energy. The separating device is inserted into at least one conductor of the supply line and can prevent the supply of electrical energy and thus the provision of electrical voltage in the interior of the housing, if it is in its separated state. The monitoring unit can switch the separating device into its separated state as a function of the liquid monitoring signal so that unsafe operating states can be avoided and the risks of explosion prevented.

The monitoring unit is equipped to evaluate the liquid monitoring signal. In the event that an insufficient explosion protection is determined by means of this evaluation, the monitoring unit generates a first output signal. Otherwise, a second output signal can be generated. The first output signal is generated if the at least one liquid monitoring signal specifies that at least one of the two passage channels encompasses an insufficient filling with liquid such that a spark gap could form. Such an operating state is thus avoided.

Preferably, the first output signal, which characterizes insufficient explosion protection, is used to switch the separating device into its separated state and to interrupt the voltage and current supply for the components in the housing. In the alternative or additionally, an alarm or a corresponding display signal, respectively, could also be generated for an operator by means of the first output signal and/or the second output signal.

The monitoring unit can furthermore be connected to a temperature sensor, which generates a temperature signal, which is characteristic for the surface temperature at the outer surface of the housing. The temperature signal can be evaluated in the monitoring unit. A third output signal, which characterizes insufficient explosion protection is generated by means of the monitoring unit, and an alarm and/or the switchover of the separating device into the separated state is generated, in particular if the temperature signal exceeds a predetermined threshold value. An excessive surface temperature in the housing can trigger an explosion in an explosive environment. This risk is avoided by monitoring the surface temperature.

Preferably, the circulation of the liquid in the liquid cycle is continued so as to lower the temperature, if an excessive surface temperature of the housing has been determined. A liquid pump, which is optionally present in the liquid cycle, thus remains in operation.

The temperature sensor for monitoring the surface temperature can be arranged at the outer surface of the housing for directly measuring the surface temperature. In the alternative, it is also possible to measure the temperature of the atmosphere in the interior of the housing, which is characteristic for the surface temperature at the outer surface of the housing. A further possibility is to determine the temperature, which is also characteristic for the surface temperature, at the first heat exchanger unit. A plurality of temperature sensors can further be arranged at one or a plurality of the mentioned locations. Redundant temperature information can be determined through this, which further increases the safety.

In a preferred exemplary embodiment, each leadthrough unit includes a leadthrough body in which the passage channel runs. Preferably, the leadthrough body has a flameproof external thread.

A sealing flange can be utilized axially adjacent to this external thread so as to attain a seal between the leadthrough body and the housing wall, in particular of the outer surface. The protection level according to EN 60529 can be increased through this. A flameproof fastening to the wall of the housing can be provided via the flameproof external thread of the leadthrough body.

Other objects and advantages of the invention will become apparent upon reading the following detailed description and upon reference to the drawings, in which:

Figure 1:
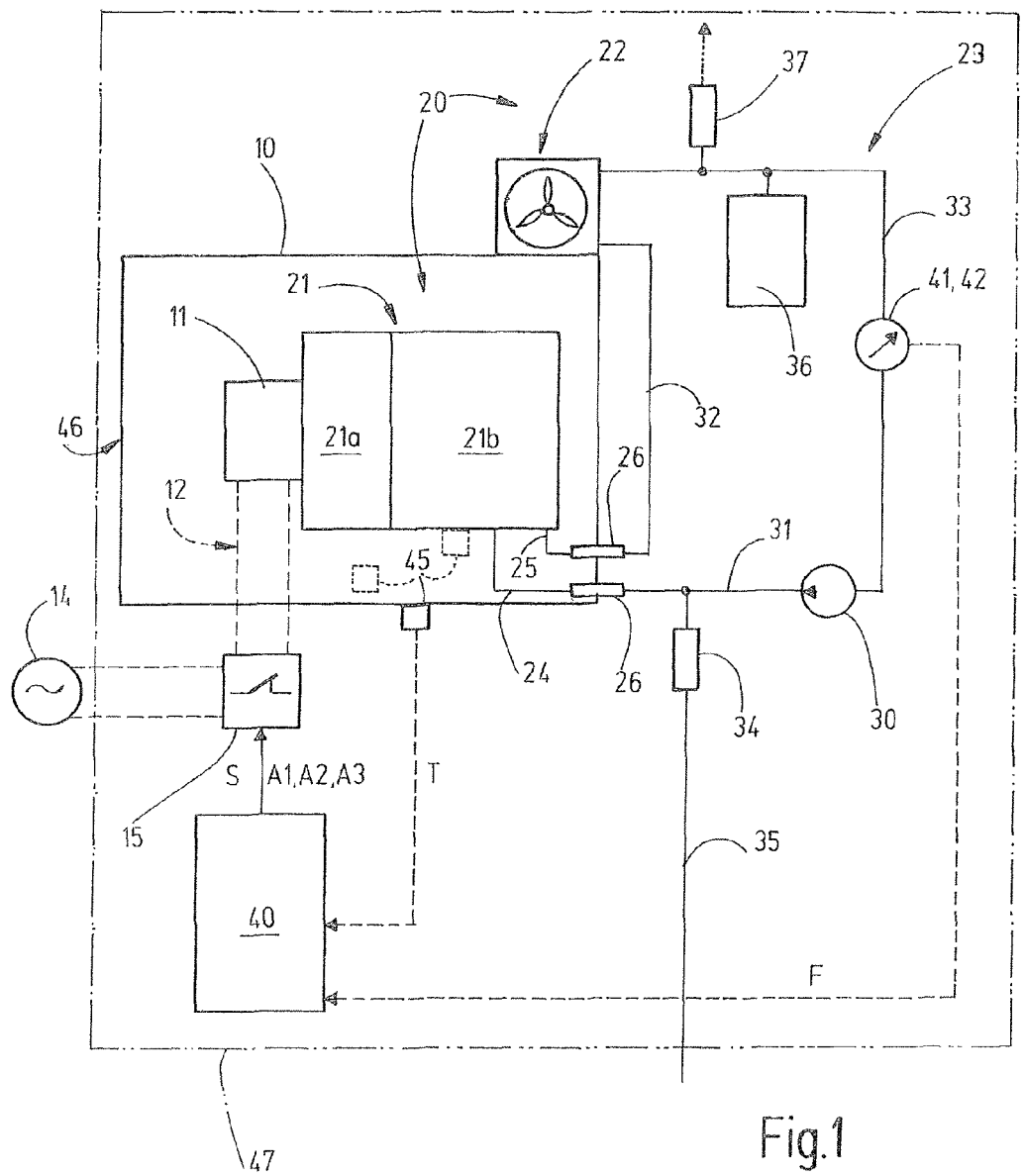
FIG. 1 is a diagrammatic depiction of a pressure-tight encapsulated housing having a temperature control device in accordance with the invention.
Figure 2:
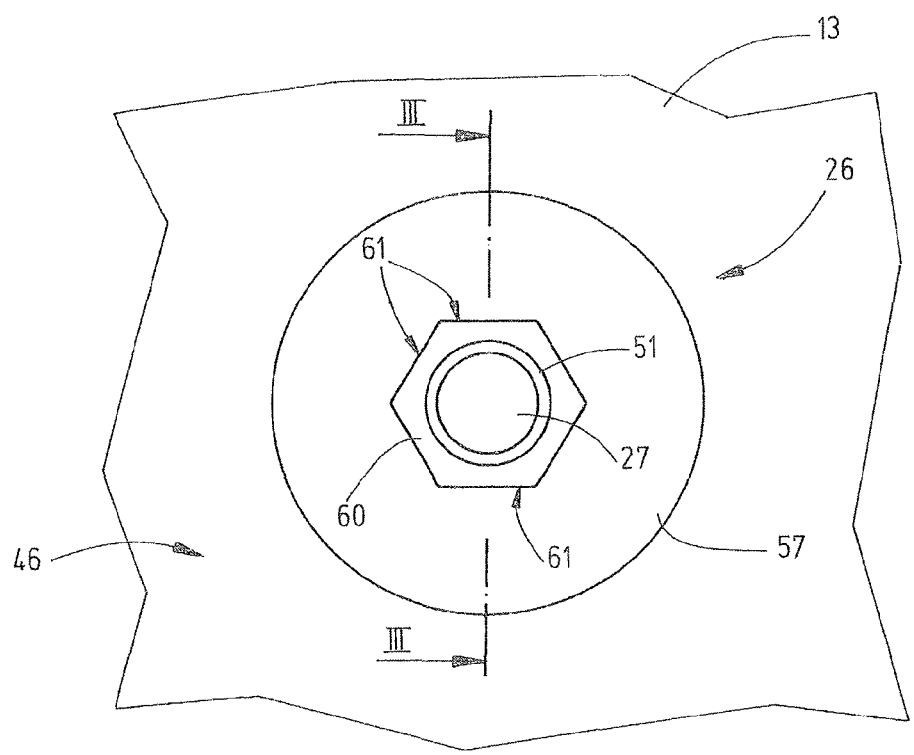
FIG. 2 is an end view of a leadthrough body in a wall of the illustrated housing.

While the invention is susceptible of various modifications and alternative constructions, certain illustrative embodiments thereof have been shown in the drawings and will be described below in detail. It should be understood, however, that there is no intention to limit the invention to the specific forms disclosed, but on the contrary, the invention is to cover all modifications, alternative constructions, and equivalents falling within the spirit and scope of the invention.

DETAILED DESCRIPTION OF THE PREFERRED EMBODIMENTS

Referring now more particularly to the drawings, there is shown an illustrated explosion-protected housing 10 in an ignition protection type pressure-tight encapsulation (Ex-d) in accordance with the invention. One or a plurality of electrical and/or electronic components 11 are arranged in the housing 10. The illustrated component 11 is supplied with electrical energy via an electrical supply line 12. The supply line 12 is guided through a wall 13 of the housing 10 in a flameproof manner. The supply line 12, which can include two or more electrical conductors, in this instance is connected to a main voltage source 14.

A controllable separating device 15, such as a switch, is arranged in the supply line 12 or in at least one conductor of the supply line 12. In its separated state, the separating device 15 interrupts the voltage and current supply of the component 11. The separating device 15 can be switched into this separated state by means of a corresponding control signal S. For purposes herein electrical lines are illustrated in FIG. 1 by means of dashed lines for distinguishing them from the liquid lines, which will be described below.

A temperature control device 20 for controlling the temperature of the at least one component 11 is assigned to the housing 10. The temperature control device 20 can serve to cool and/or heat the component 11.

The temperature control device 20 includes a first heat exchanger unit 21, which is arranged in the interior of the housing 10, and a second heat exchanger unit 22, which is arranged outside of the housing 10. The two heat exchanger units 21, 22 are connected to one another via a liquid cycle or circuit 23. A liquid, e.g. water or oil, which serves as heat transfer medium, circulates in the lines of the liquid cycle 23 for transporting heat between the two heat exchanger units 21, 22.

The heat exchanger units 21, 22 may be of known type. In the case illustrated embodiment shown in FIG. 1, the first heat exchanger unit 21 includes a heat transfer part 21a, which is in heat-transferring contact with the component 11, as well as a part 21b on the medium side, which is in heat-transferring contact with the heat transfer part 21a. The part 21b is connected to the liquid cycle and the liquid, which circulates at that location, flows through it.

In the interior of the housing 10, the liquid cycle 23 includes a feed line 24 as well as a return line 25, which are in each case fluidically connected to the first heat exchanger unit 21 and, in the illustrated embodiment to the part 21b on the medium side. The feed line 24 and the return line 25 each is connected to a respective leadthrough unit 26 in the interior of the housing 10. Each leadthrough unit 26 includes a passage channel 27 (FIG. 3) through which liquid can flow into the feed line 24 or can flow out of the return line 25, respectively. The leadthrough units 26 are inserted into a wall 13 of the housing 10 in a flameproof manner.

In the illustrated embodiment, the liquid cycle 23 includes a liquid pump 30 arranged outside of the housing 10, for example, and thus embodied in an explosion-protected manner. In the alternative, the liquid pump 30 could be arranged in the housing 10 in an explosion-protected manner. In this instance, the liquid pump 30 is fluidically connected downstream to the feed line 24 via a first liquid line 31 and one of the two leadthrough units 26.

A second liquid line 32 of the liquid cycle 23 is fluidically connected via the respective other leadthrough unit 26 to the return line 25 and leads to the second heat exchanger unit 22. A third liquid line 33 of the liquid cycle 23 leads from the second heat exchanger unit 22 back to the liquid pump 30. A closed liquid cycle 23 is thus created.

In the exemplary embodiment, an overpressure valve 34 is connected to the first liquid line 31 so that a liquid amount can be discharged from the liquid cycle 23 in response to an excessive liquid pressure downstream from the liquid pump for reducing the pressure. For this purpose, the overpressure valve 34 is connected to an overpressure line 35.

A compensating reservoir 36 can be connected to the liquid cycle 23 and, in the illustrated embodiment, to the third liquid line 33 upstream of the liquid pump 30. The compensating reservoir 36 is preferably a membrane reservoir. It can be ensured via the compensating reservoir 36 that a sufficient amount of liquid always is provided to the liquid pump 30. In order to to remove gas and in particular air from the liquid cycle 23, the latter includes a bleeder 37. The bleeder 37 is advantageous, in particular, if a gas-emitting membrane reservoir is used as compensating reservoir 36 so as to be able to remove the gas or air, respectively, which permeates into the liquid from the liquid cycle 23.

A monitoring unit 40 also is illustrated in the embodiment illustrated in FIG. 1. In addition, at least one liquid monitoring sensor 41 is provided, which in this case is a pressure sensor 42. The liquid monitoring sensor 41 generates a liquid monitoring signal F, which is transmitted to the monitoring unit 40 for evaluation.

In the illustrated embodiment, a single liquid monitoring sensor 41 is provided in the form of the pressure sensor 42. The pressure sensor 42 measures the pressure at a location of the liquid cycle 23. In the illustrated embodiment, the liquid pressure is measured at that location of the liquid cycle 23 at which the lowest liquid pressure prevails. In this instance, the pressure sensor 42 is thus arranged upstream of the liquid pump 30 at the suction side thereof, in this case being inserted into the third liquid line 33. Alternatively, the liquid pressure could also be measured at a plurality of locations in the liquid cycle 23 and a liquid monitoring signal F could in each case be generated and be transmitted to the monitoring unit 40.

The liquid pressure in the liquid cycle 23 serves as measure of whether the passage channels 27 of the two leadthrough units 26 are filled with liquid to a sufficient extent so that spark gaps cannot form at that location within the passage channel 27. Preferably, if the liquid closes the cross section of the passage channel 27 completely, the formation of a spark gap is prevented in the passage channel 27. According to the invention, this is monitored via the at least one liquid monitoring sensor 41. If the liquid pressure within the liquid cycle 23 is sufficiently large at every location, the liquid lines are filled completely with liquid and the formation of a spark gap is avoided. Hence, in the illustrated embodiment, the pressure sensor 42 is used as liquid monitoring sensor 41.

Alternatively or in addition, a fill level sensor, which directly measures the fill level of liquid in the liquid cycle 23, could also be used as liquid monitoring sensor 41. A plurality of such fill level sensors could also be used. For example, a fill level sensor could be assigned to each leadthrough unit 26.

A further modification of the preferred exemplary embodiment is to use one or a plurality of temperature sensors as at least one liquid monitoring sensor. By measuring the temperature at a location in the interior of the housing 10, for example, it can be determined, whether a sufficient cooling or temperature control, respectively, takes place. This is ensured, if a sufficiently large volume or mass flow of the liquid circulates through the liquid cycle 23. A temperature evaluation can thus also indirectly specify the filling in the liquid cycle 23 and thus also in the passage channels 27. In addition, it is also possible to measure the volume flow and/or the mass flow in the liquid cycle 23 and preferably in at least one of the passage channels 27 and to generate the liquid monitoring signal F accordingly. It will be understood that a combination of the described possibilities of liquid monitoring sensors 41 can also be used.

A temperature signal T of a temperature sensor 45 is furthermore transmitted to the monitoring unit 40 in the case of the exemplary embodiment. The temperature sensor 45 serves to determine the surface temperature of at least one location at the outer surface 46 of the housing 10. Regardless of whether different surface temperatures appear at the outer surface 46 of the housing 10 at different locations, it is sufficient to determine the currently prevailing maximum surface temperature value at the outer surface 46 of the housing 10. The surface temperature is not to exceed a predetermined value. Otherwise, the housing 10 itself could serve as ignition source in an explosive environment. The temperature sensor 45 thus generates a temperature signal T, which describes the surface temperature or the currently prevailing maximum surface temperature value, respectively, at the outer surface 46.

As illustrated in FIG. 1, the temperature sensor 45 can be arranged directly at the outer surface 46 of the housing 10 and can measure the surface temperature thereof. Depending on the arrangement of the heat-emitting components 11 in the interior of the housing 10, a plurality of temperature sensor 45 can also be arranged on the outer surface 46 of the housing 10 at different locations, so as to be able to determine the currently prevailing maximum surface temperature value, in particular if the surface temperatures of the housing 10 can differ from one another at different locations. In addition or in the alternative the temperature can also be determined at least one other location, which is characteristic or defining for the surface temperature at the outer surface 46, for example the temperature in the atmosphere in the interior of the housing 10 and/or the temperature at the first heat exchanger unit 21 and/or the temperature at the at least one component 11. Exemplary alternative or additional possibilities for arranging a temperature sensor 45 are illustrated in FIG. 1 by means of dotted lines.

The arrangement according to FIG. 1 operates as follows:

The temperature of at least one electrical and/or electronic component 11 is controlled, for example cooled, via the temperature control device 20 within the pressure-tightly encapsulated housing 10. The heat is transferred via the first heat exchanger unit 21 to the liquid, which serves as heat transfer medium, and is transported to the second heat exchanger unit 22 outside of the housing by means of the liquid. At that location, the heat is emitted into the environment. The second heat exchanger unit 22 can include a blower by way of example. The circulation of the liquid is maintained via the liquid pump 30.

The explosion-protected state of the housing 10 is monitored via the temperature signal T of the temperature sensor 45 as well as via the liquid monitoring signal F of the liquid monitoring sensor 41. In the event that the temperature signal T rises above a predetermined threshold value, the explosion protection is no longer in hand. The monitoring unit 40 then generates a third output signal A3, which characterizes the insufficient explosion protection.

A first output signal A1, which indicates the insufficient explosion protection, is generated, if the filling of the passage channels 27 of the two leadthrough units 26 with liquid is insufficient. For this purpose, the liquid monitoring signal F is evaluated by means of the monitoring unit 40, according to the example thus the pressure in the liquid cycle 23, which is measured by the pressure sensor 42. In the event that the pressure is insufficient, spark gaps can form in the passage channels 27 so that the state of the pressure-tight encapsulation (Ex-d) is no longer guaranteed.

Otherwise, if the filling of the passage channels is sufficient and if the surface temperature of the outer surface 46 of the housing 10 lies within the admissible range, the monitoring unit 40 generates a second output signal A2, which specifies that the monitored parameters correspond to the requirements of the explosion protection.

The output signals A1, A2, A3 can be used as control signal for the separating device 15. If the second output signal A2 is generated, the separating device 15 remains in its conductive state and provides for the supply of the at least one component 11 with electrical energy. As soon as the first output signal A1 and/or the third output signal A3 are generated, this signal serves as control signal S for switching the separating device 15 into the separated state. The voltage and current supply of the at least one component 11 with electrical energy via the supply line 12 is prevented.

In the alternative or in addition, an optical and/or acoustic and/or haptic alarm signal, which displays the insufficient explosion protection and optionally also the reason (excessive surface temperature in response to the third output signal A3 and/or insufficient liquid fill level in the passage channel in response to the first output signal A1), could also be generated for an operator via the first output signal A1 and/or the third output signal A3. It will be understood that it is also possible to display or output the proper state optically and/or acoustically and/or haptically, if the second output signal A2 is generated by means of the monitoring unit 40.

As is illustrated in FIG. 1 by means of the dash-dotted line, the pressure-tight encapsulated housing 10 as well as the temperature control device 20 can be arranged in and/or at an outer housing 47.

Figure 3:
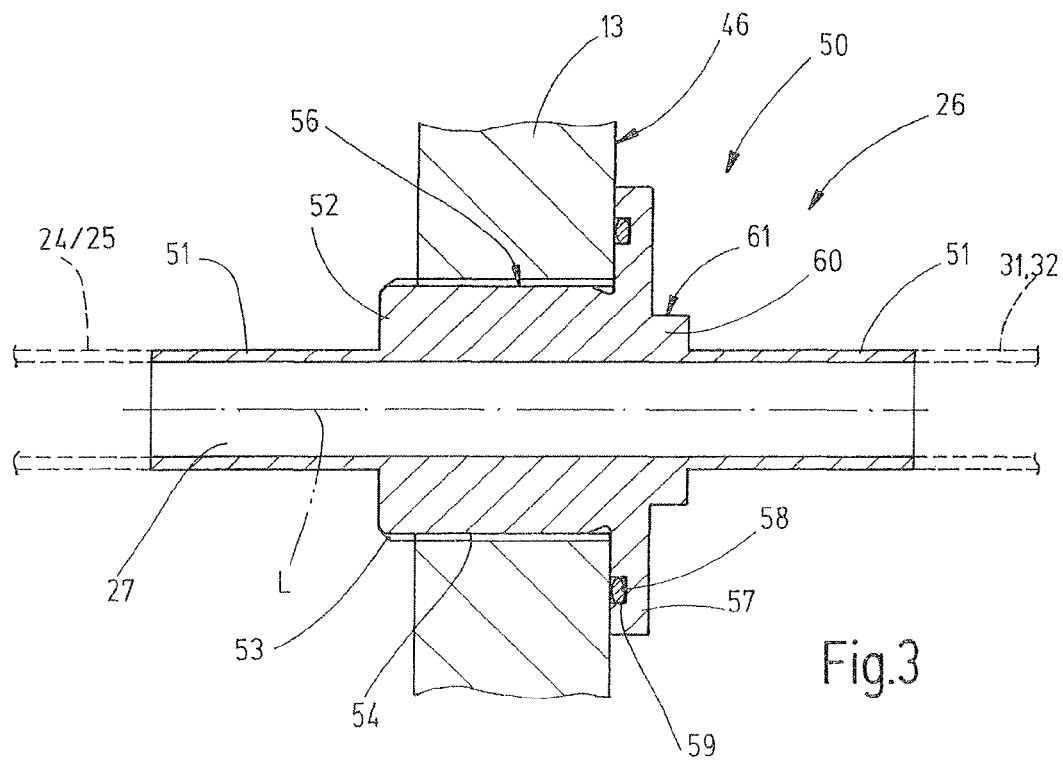
FIG. 3 is a longitudinal section of the leadthrough body taken in the plane of line III-III in FIG. 2.

An exemplary embodiment of a leadthrough unit 26 is illustrated in FIG. 3. The leadthrough unit 26 includes a leadthrough body 50, through which the passage channel 27 extends. According to the example, the passage channel 27 is cylindrical and extends along a longitudinal axis L. The two openings of the passage channel 27 are in each case present at a tubular end section 51 of the leadthrough body. The two tubular end sections are connected to one another via a central section 52 comprising a larger outer diameter. A flameproof external thread 53 is present at the central section 52. In the case of the exemplary embodiment, the wall 13 has a flameproof internal thread 54 with which the external thread 53 engages. In the ease of the exemplary embodiment, the internal thread 54 is present directly in the wall 13 of the housing 10, or alternatively in a threaded bushing, which is provided at that location in a flameproof manner. With its external thread 53, the leadthrough body 50 is thus screwed directly into the through-hole in the wall 13, which is limited by the internal thread 54. Together, the external thread 53 and the internal thread 54 represent a flameproof fastening means 55 for fastening the leadthrough unit 26 to the wall 13 of the housing 10, as it is shown in FIG. 3. A flameproof thread gap 56 is formed between the internal thread 54 and the external thread 53 by means of the thread engagement.

In the direction of the longitudinal axis L adjacent to the external thread 53, the leadthrough body 50 encompasses a sealing flange 57, the outer diameter of which is larger than that of the external thread 53. At least one seal 58 can be arranged between the sealing flange 57 and the wall 13 of the housing 10, to increase the degree of protection. In the case of the exemplary embodiment described herein, the seal 58 is inserted into a ring-shaped, in particular circular ring-shaped groove 59. On the side of the sealing flange 57, which faces the external thread 53, the groove 59 is open and can thus come into contact with the wall 13 or with the outer surface 46, respectively.

A seizing part 60 for seizing the sealing body 50 by means of a tool can be present on the side of the sealing flange 57, which faces away from the external thread 53. The seizing part 60, for example, may be in the form of a hexagon head comprising six seizing surfaces 61 for an open-ended wrench or a similar tool. The leadthrough body 50 can thus be rotated by means of a tool when tightening and can be tightly attached to or removed from, respectively, the wall 13 of the housing 10.

The lines of the liquid cycle 23 are in each case connected to a tubular end section 51 in the interior of the housing 10 or outside of the housing 10, respectively, schematically illustrated in FIG. 3 by means of dashed lines.

In the case of all of the exemplary embodiments, the liquid, which is used as heat transfer medium, is preferably chosen such that neither the liquid itself, nor the disintegration products thereof are combustible or represent or contain or release explosive substances.

From the foregoing, it can be seen that the invention relates to a pressure-tight encapsulated housing 10 comprising a temperature control device 20 as well as to a method for monitoring the pressure-tight encapsulated housing 10. The temperature control device includes a first heat exchanger unit 21, which is arranged in the interior of the housing 10, and a second heat exchanger unit 22 outside of the housing 10. The heat exchanger units 21, 22 are fluidically connected to one another via liquid lines of a liquid cycle 23. Two leadthrough units 26, which in each case encompass a passage channel 27, are located in the wall 13 of the housing 10. The passage channels 27 are part of the liquid cycle 23 and are fluidically connected to the respective assigned lines, both in the interior as well as outside of the housing. A liquid monitoring sensor 41 generates a liquid monitoring signal F, which specifies, if the filling of a passage channel 27 in a leadthrough unit 26 is insufficient. This is so, because, in this case, a spark gap can be created in the leadthrough unit 26 via the passage channel 27. The liquid monitoring signal F is transmitted to a monitoring unit 40, which evaluates the signal. If this evaluation shows that the degree of filling or the fill level, respectively, within the passage channel 27 is too low and the explosion protection requirements are no longer fulfilled, the monitoring unit 40 generates a first output signal A1. An alarm can be executed via this output signal A1 and/or the components 11 can be switched to be voltage-free and current-free within the housing 10.

LIST OF REFERENCE NUMERALS 10 housing
11 component
12 supply line
13 wall
14 mains voltage source
15 separating device
20 temperature control device
21 first heat exchanger unit
21a heat transfer part
21b part on the medium side
22 second heat exchanger unit
23 liquid cycle 24 feed line
25 return line
26 leadthrough unit
27 passage channel
30 liquid pump
31 first liquid line
32 second liquid line
33 third liquid line
34 overpressure valve
35 overpressure line
36 compensating reservoir
37 bleeder
40 monitoring unit
41 liquid monitoring unit
42 pressure sensor
45 temperature sensor
46 outer surface of the housing
47 outer housing
50 leadthrough body
51 tubular end section
52 central section
53 external thread
54 internal thread
55 fastening means
56 flameproof gap
57 sealing flange
58 seal
59 groove
60 seizing part
61 seizing surface
A1 first output signal
A2 second output signal
A3 third output signal
F liquid monitoring signal
L longitudinal axis
S control signal
T temperature signal

The invention claimed is:

1. An explosion protected housing arrangement comprising a pressure-tight encapsulated housing (10),
   a temperature control device (20) including a first heat exchanger unit (21) arranged in the interior of the housing (10) and a second heat exchanger unit (22), arranged outside of the housing (10),
   said heat exchanger units (21, 22) being connected to one another via a liquid cycle (23),
   said liquid cycle (23) including a feed line (24) and a return line (25), each connected to the first heat exchanger unit (21) and which each fluidically connect to a passage channel (27) of a respective leadthrough unit (26),
   said leadthrough units (26) being arranged in a flameproof manner in a wall (13) of the housing (10) with a fastener (55) so that the passage channel (27) extends through the wall (13),
   a liquid monitoring sensor (41) for generating liquid monitoring signal (F) characteristic of the filling of the passage channels (27) with liquid, and
   a monitoring unit (40) for receiving signals generated by the liquid monitoring sensor (41).

2. The housing arrangement of claim 1 in which said monitoring unit (40) is connected to a controllable separating device (15) connected to an electrical supply line (12) which leads into the housing (10) and which interrupts the supply of electrical energy into the housing (10) when in a separated state.

3. The housing arrangement of claim 1 in which said monitoring unit (40) is operable for evaluating the liquid monitoring signal (F) and generating a first output signal (A1) indicative of insufficient explosion protection of the housing if the liquid monitoring signal (F) of the liquid monitoring sensor (41) indicates that at least one of the two passage channels (27) is insufficiently filled with liquid.

4. The housing arrangement of claim 1 in which said monitoring unit (40) is connected to a controllable separating device (15) connected to an electrical supply line (12) which leads into the housing (10) and which interrupts the supply of electrical energy into the housing (10) when in a separated state and said monitoring unit (40) is operable for evaluating the liquid monitoring signal (F) and generating a first output signal (A1) indicative of insufficient explosion protection of the housing if the liquid monitoring signal (F) of the liquid monitoring sensor (41) indicates that at least one of the two passage channels (27) is insufficiently filled with liquid.

5. The housing arrangement of claim 4 in which said monitoring unit (40) is operable for switching the separating device (15) into the separated state by means of the first output signal (A1) that is indicative of insufficient explosion protection.

6. The housing arrangement of claim 1 in which said liquid monitoring sensor (41) is a fill level sensor for measuring the fill level in a respective passage channel (27) of a leadthrough unit (26).

7. The housing arrangement of claim 1 in which said liquid monitoring sensor (41) is a pressure sensor (42) for measuring liquid pressure in the liquid cycle (23).

8. The housing arrangement of claim 2 in which said monitoring unit (40) is connected to at least one temperature sensor (45) which generates a temperature signal (T) indicative of a surface temperature value at an outer surface (46) of the hosing (10).

9. The housing arrangement of claim 8 in which said monitoring unit (40) is operable for generating a third output signal (A3) indicative of insufficient explosion protection of the housing if the temperature signal (T) of the temperature sensor (45) exceeds a predetermined threshold value.

10. The housing arrangement of claim 9 in which said monitoring unit (40) is operable for switching the separating device (15) into the separated state by means of the third output signal (A3) indicative of insufficient explosion protection.

11. The housing arrangement of claim 8 in which the temperature sensor (45) is arranged at an outer surface (46) of the housing (10).

12. The housing arrangement of claim 8 in which the temperature sensor (45) is arranged in the interior of the housing (10).

13. The housing arrangement of claim 8 in which the temperature sensor (45) is at an electrical component (11) within the interior of the housing (10).

14. The housing arrangement of claim 1 in which each leadthrough unit (26) has a leadthrough body (50) with an external thread (53) and a passage channel (27) extending axially through the body (50).

15. The housing arrangement of claim 14 in which each leadthrough body (50) has a sealing flange (57) axially adjacent to the external thread (53).

16. A method for monitoring a pressure tight encapsulated housing (10) comprising the steps of:
   providing a temperature control device (20) having a first heat exchanger unit (21), and a second heat exchanger unit (22), arranging the first heat exchange unit in the interior of the housing (10), arranging the second heat exchanger unit (22) outside of the housing (10), connecting the two exchanger units (21, 22) to one another via a liquid cycle (23) that includes a feed line (24) and a return line (25) which are connected to the first heat exchanger unit (21) in the interior of the housing (10) and which in each are fluidically connected to a passage channel (27) of a respective leadthrough unit (26) arranging the leadthrough units (26) in a wall (13) of the housing (10) in a flameproof manner by means of fasteners with the passage channels (27) extending through the wall (13), sensing the filling of the passage channels (27) with liquid by at least one sensor and transmitting signals indicative of liquid in the channels to a monitoring unit (40).

\* \* \* \* \*